United States Patent
Meaney et al.

(10) Patent No.: US 8,782,485 B2
(45) Date of Patent: Jul. 15, 2014

(54) HIERARCHICAL CHANNEL MARKING IN A MEMORY SYSTEM

(75) Inventors: Patrick J. Meaney, Poughkeepsie, NY (US); Eldee Stephens, Waterbury, CT (US); Luis A. Lastras-Montano, Cortlandt Manor, NY (US); Judy S. Johnson, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 13/353,925

(22) Filed: Jan. 19, 2012

(65) Prior Publication Data

US 2013/0191698 A1    Jul. 25, 2013

(51) Int. Cl.
*H03M 13/00* (2006.01)

(52) U.S. Cl.
USPC .................. 714/758; 714/763; 714/768

(58) Field of Classification Search
USPC ................ 714/758, 763, 768, 718, 789, 15
See application file for complete search history.

(56) References Cited

U.S. PATENT DOCUMENTS

| | | | |
|---|---|---|---|
| 5,537,104 A * | 7/1996 | Van Dort et al. ............. 340/3.71 |
| 5,864,752 A * | 1/1999 | Pinder ......................... 455/161.3 |
| 5,998,868 A | 12/1999 | Pogge et al. |
| 6,154,400 A * | 11/2000 | Wang et al. ................... 365/202 |
| 6,282,686 B1 | 8/2001 | Cypher |
| 6,397,365 B1 | 5/2002 | Brewer et al. |
| 7,096,407 B2 | 8/2006 | Olarig |
| 7,155,568 B2 | 12/2006 | Richard et al. |
| 7,200,770 B2 | 4/2007 | Hartwell et al. |
| 7,320,086 B2 | 1/2008 | Majni et al. |
| 7,509,419 B2 * | 3/2009 | Elnozahy et al. ............. 709/225 |
| 7,757,123 B1 | 7/2010 | Gasser et al. |
| 7,890,811 B2 | 2/2011 | Rothman et al. |
| 8,225,036 B2 | 7/2012 | Koga |
| 8,266,501 B2 | 9/2012 | Jeddeloh |
| 8,327,225 B2 | 12/2012 | Jeddeloh |
| 8,484,529 B2 | 7/2013 | Alves et al. |
| 8,489,792 B2 * | 7/2013 | Byrne et al. .................. 710/306 |

(Continued)

FOREIGN PATENT DOCUMENTS

JP       2000002664 A       1/2000
JP       2004047542 A       12/2004

OTHER PUBLICATIONS

On Chip Error Correcting Techniques for New Generation Flash Memories; Proceedings of the IEEE vol. 91; No. 4; Apr. 2003; pp. 602-616.

(Continued)

*Primary Examiner* — Fritz Alphonse
(74) *Attorney, Agent, or Firm* — Cantor Colburn LLP; Margaret McNamara

(57) ABSTRACT

Channel marking is provided in a memory system that includes a first memory channel, a second memory channel, and error correction code (ECC) logic. The memory system is configured to perform a method that includes receiving a request to apply a first channel mark to the first memory channel and determining a priority level of the first channel mark. A request is received to apply a second channel mark to the second memory channel, and a priority level of the second mark is determined. It is determined that the priority level of the first channel mark is higher than the priority level of the second channel mark. The first channel mark is supplied to the ECC logic while blocking the second channel mark from the ECC logic.

20 Claims, 12 Drawing Sheets

(56) References Cited

U.S. PATENT DOCUMENTS

| | | |
|---|---|---|
| 2004/0168101 A1 | 8/2004 | Kubo |
| 2007/0114652 A1 | 5/2007 | Hsieh |
| 2009/0000995 A1 | 1/2009 | Yanai |
| 2009/0006900 A1 | 1/2009 | Lastras-Montano et al. |
| 2009/0031078 A1 | 1/2009 | Warnes et al. |
| 2009/0164837 A1 | 6/2009 | Swanson et al. |
| 2010/0005218 A1 | 1/2010 | Gower et al. |
| 2010/0162037 A1 | 6/2010 | Maule et al. |
| 2010/0199017 A1 | 8/2010 | Hollis |
| 2010/0293436 A1 | 11/2010 | Coteus et al. |
| 2010/0293438 A1 | 11/2010 | Lastras-Montano et al. |
| 2012/0311406 A1 | 12/2012 | Ratnam et al. |
| 2013/0191698 A1 | 7/2013 | Meaney et al. |

OTHER PUBLICATIONS

Casey Jeffery et al; "Hierarchical Fault Tolerance for Nanoscale Memories"; Nanotechnology, IEEE Transaction on vol. 5; Issue 4; Digital Object Identifier; 10.1109/TNANO.2006.877431; Publication Year 2006; pp. 407-414.

C. Jeffery et al.; "Dynamic Sparing and Error Correction Techniques for Fault Tolerance in Nanoscale Memory Structures"; Nanotechnology 2004; 4th IEEE Conference on Digital Object Identifier; 10.1109/NANO.2004.1392285; Publication Year 2004; pp. 168-170.

Girish Venkatasubramanian et al.; "Design of High Yield Defect Tolerant Self-Assembled Nanoscale Memories"; Nanoscale Architectures 2007; NANOSARCH 2007; IEEE International Symposium on Digital Object Identifier 10.1109/NANOARCH.2007.4400861; Publication Year 2007; pp. 77-84.

IP.com Electronic Publication No. IPCOM000127931D; Author: Wawrzynek, J. Title: "Memory Management in the Programming Language ICL"; www.ip.com/ipcom000127931D/; California Institute of Tecnhnology—Original Publication Date: Dec. 31, 1983.

U.S. Appl. No. 13/353,879; Non Final Office Action; Date Filed: Jan. 19, 2012; Date Mailed: Nov. 28, 2014; pp. 1-26.

U.S. Appl. No. 13/353,814; Non Final Office Action; Date Filed: Jan. 19, 2012; Date Mailed: Nov. 21, 2013; pp. 1-22.

* cited by examiner

| NEW ERRORS \ MARKS | NO MARKS IN RANK | SINGLE CHIP MARKED IN RANK | TWO CHIPS MARKED IN RANK | CHANNEL MARKED IN RANK | SINGLE CHIP & CHANNEL MARKED IN RANK | DOUBLE CHIP & CHANNEL MARKED IN RANK |
|---|---|---|---|---|---|---|
| NONE | GOOD | GOOD | GOOD | GOOD | GOOD | GOOD |
| 1 CHIP/1 BIT | CE | CE | CE | CE | CE | CE |
| 1 CHIP/>1 BIT | CE | CE | CE | CE | CE | UE |
| 2 CHIPS, SAME CHANNEL | CE | CE | CE | UE | UE | UE |
| 2 CHIPS, DIFFERENT CHANNEL | UE | UE | UE | UE | UE | UE |
| FULL CHANNEL ERROR (CRC) | CE | CE | CE | UE | UE | UE |

FIG. 5

DEVICES:  ○ BELOW THRESHOLD
          ● ABOVE THRESHOLD

| CHANNELS / RANKS | 0 | 1 | 2 | 3 | 4 |
|---|---|---|---|---|---|
| 0 | ○○○○○○○○ | | | | |
| 1 | ○○○○○○○○ | ○○○●○○○○ | ○○○○○○○○ | ○○○○○●○○ | ○○○○○○○○ |
| 2 | ○○○○○○○○ | ○○○○○○○○ | ○○○○○○○○ | ○○○○○○○○ | ○○○○○○○○ |
| 3 | ○○○○○○○○ | ○○○○○○○○ | ○○○○○○○○ | ○○○○○○○○ | ○○○○○○○○ |
| 4 | ○○○○○○○○ | ○○○○○○○○ | ●●●○○○○○ | ○○○○○○○○ | ○○○○○○○○ |
| 5 | ○○○○○○○○ | ○○○○○○○○ | ○○○○○○○○ | ○○○○○○○○ | ○○○○○○○○ |
| 6 | ○○○○○○○○ | ○○○○○○○○ | ○○○○○○○○ | ○○○○○○○○ | ○○○○○○○○ |
| 7 | ○○○○○○○○ | ○○○○○○○○ | ○○○○○○○○ | ○○○○○○○○ | ○○○○○○○○ |

*FIG. 6A*

| MARKS RANKS | PER RANK CHIP X | PER RANK CHIP Y | PER RANK CHANNEL |
|---|---|---|---|
| 0 | - | - | - |
| 1 | CHAN 3/CHIP 7 | CHAN 1/CHIP 2 | 3 |
| 2 | - | - | - |
| 3 | - | - | - |
| 4 | CHAN 2/CHIP 1 | CHAN 2/CHIP 8 | 2 |
| 5 | - | - | - |
| 6 | - | - | - |
| 7 | - | - | - |

*FIG. 6B*

| SCENARIO | FULL CHANNEL MARKING | PER-RANK CHANNEL MARKING | HIERARCHICAL CHANNEL MARKING |
|---|---|---|---|
| NO ERRORS | CE, NO MARK | CE, NO MARK | CE, NO MARK |
| 1 CHIP | CE, MARK | CE, MARK | CE, MARK |
| 2 CHIPS, ANY MAGNITUDE SIMULTANEOUS, SAME CHANNEL | CE MARK DRAMs | CE MARK DRAMs | CE MARK DRAMs |
| 2 CHIPS, ANY MAGNITUDE SIMULTANEOUS, DIFF CHANNELS, NO PRE MARKS | UE | UE | UE |
| THREE CHIP KILLS ON RANK A, CHANNEL 0. THREE CHIP KILLS ON RANK B, CHANNEL 1. DURING CALL HOME, DRAM FAILS ON RANK B CHANNEL 1 | CALL HOME MARK Chan0 UE | CALL HOME MARK RankA Chan0 MARK RankB Chan1 | CALL HOME MARK RankA Chan0 MARK RankB Chan1 |
| TWO CHIP KILLS, THIRD CHIP KILL COMES UP (chan0) TO CAUSE CALL HOME DURING CALL HOME, SOFT CRC IN CHANNEL 1 ON DIFFERENT RANK ONLY | CALL HOME MARK Chan0 UE | CALL HOME MARK RankA Chan0 MARK CHANNEL 1 UE ON RANK A | CALL HOME MARK RankA Chan0 MARK RankB Chan1 |

HIERARCHICAL CHANNEL MARKING IN A MEMORY SYSTEM

BACKGROUND

The present invention relates generally to computer memory, and more specifically, to channel marking in a memory system.

Memory device densities have continued to grow as computer systems have become more powerful. With the increase in density comes an increased probability of encountering a memory failure during normal system operations. Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. If there is a single error present in the data word during a read operation, it can be detected by regenerating parity from the data and then checking to see that it matches the stored (originally generated) parity.

Richard Hamming recognized that the parity technique could be extended to not only detect errors, but to also correct errors by appending an XOR field, an error correction code (ECC) field, to each data, or code, word. The ECC field is a combination of different bits in the word XOR-ed together so that some number of errors can be detected, pinpointed, and corrected. The number of errors that can be detected, pinpointed, and corrected is related to the length of the ECC field appended to the data word. ECC techniques have been used to improve availability of storage systems by correcting memory device (e.g., dynamic random access memory or "DRAM") failures so that customers do not experience data loss or data integrity issues due to failure of a memory device.

Redundant array of independent memory (RAIM) systems have been developed to improve performance and to increase the availability of storage systems. RAIM distributes data across several independent memory modules (each memory module contains one or more memory devices). There are many different RAIM schemes that have been developed each having different characteristics, and different pros and cons associated with them. Performance, availability, and utilization/efficiency (the percentage of the disks that actually hold customer data) are perhaps the most important. The tradeoffs associated with various schemes have to be carefully considered because improvements in one attribute can often result in reductions in another.

SUMMARY

An embodiment is a memory system that includes a first memory channel, a second memory channel, and error correction code (ECC) logic. The memory system is configured to perform a method that includes receiving a request to apply a first channel mark to the first memory channel and determining a priority level of the first channel mark. A request is received to apply a second channel mark to the second memory channel, and a priority level of the second mark is determined. It is determined that the priority level of the first channel mark is higher than the priority level of the second channel mark. The first channel mark is supplied to the ECC logic while blocking the second channel mark from the ECC logic. The supplying causes the ECC logic to compensate for errors associated with the first channel and the blocking causes the ECC logic to perform error correction on errors associated with the second channel.

Other embodiments include a computer implemented method and a computer program product for receiving a request to apply a first channel mark to a first memory channel and for determining a priority level of the first channel mark. A request to apply a second channel mark to a second memory channel is received and a priority level of the second mark is determined. It is determined that the priority level of the first channel mark is higher than the priority level of the second channel mark. The first channel mark is supplied to ECC logic while blocking the second channel mark from the ECC logic. The supplying causes the ECC logic to compensate for errors associated with the first channel, and the blocking causes the ECC logic to perform error correction on errors associated with the second channel.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5 illustrates a table of error coverage of per-rank channel marking in accordance with an embodiment;

FIG. 6A illustrates examples of defects in various ranks in accordance with an embodiment;

FIG. 6B illustrates an example of a marking table in accordance with an embodiment;

FIG. 10 illustrates a table of error coverage in accordance with an embodiment and a particular set of defects.

DETAILED DESCRIPTION

Figure 1:
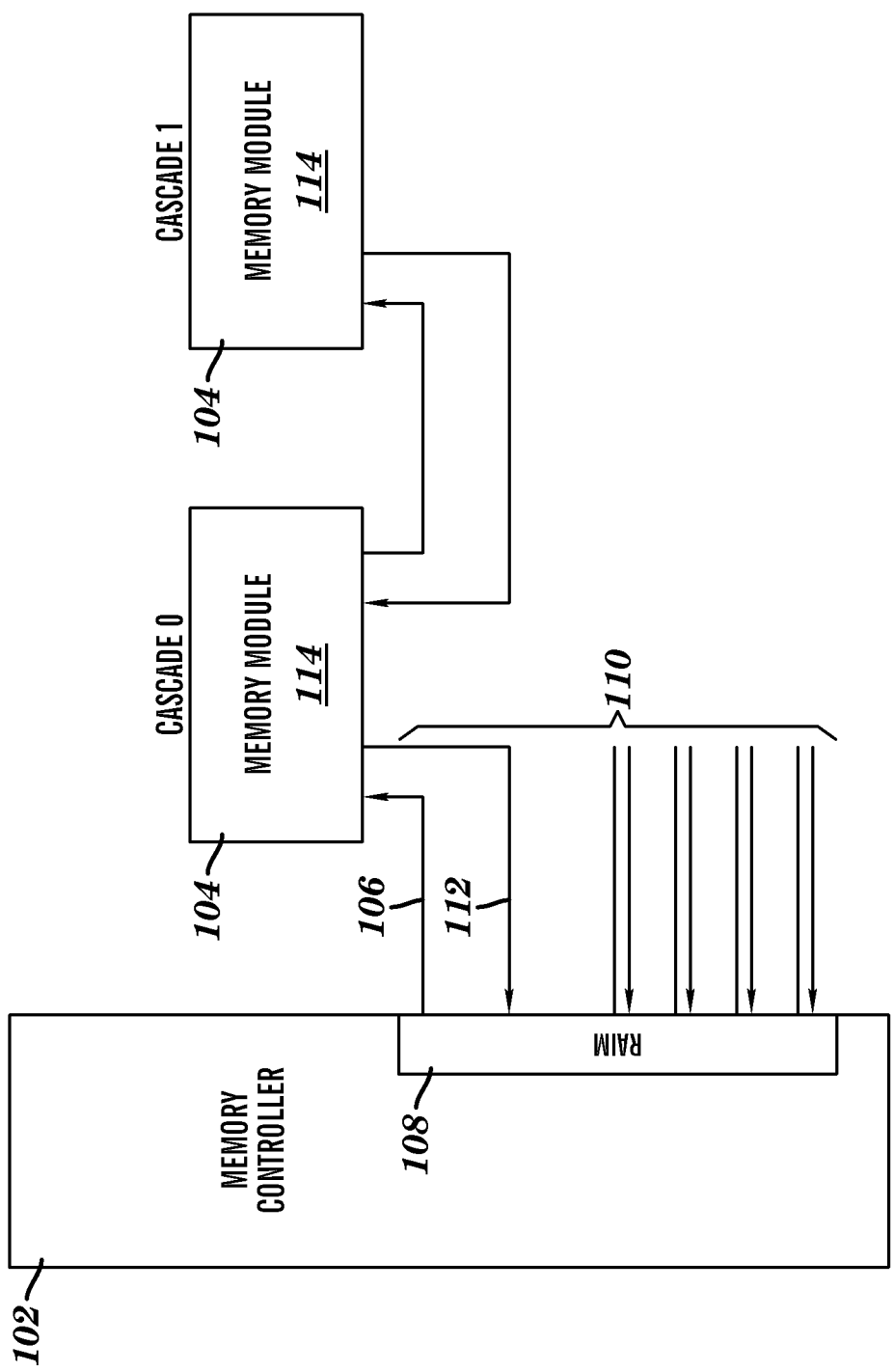
FIG. 1 illustrates a block diagram of a cascade interconnect memory system that may be implemented in accordance with an embodiment.

Embodiments of the present invention are directed to per-rank channel marking. Per-rank channel marking allows ranks within a memory system to have two different channels marked at the same time. Embodiments of the present invention are also directed to hierarchical channel marking which allows a mark to be applied to one rank within a channel or to an entire channel (all ranks) depending on the type of memory error encountered.

One method of improving performance and reliability in memory systems is to "mark" individual memory devices as potentially faulty. When a memory device is marked, the ECC hardware treats this memory device as an unreliable source of data. Therefore, all bits from that device get ignored by the ECC logic and only the remaining memory devices get used in the final determination of data. By ignoring the marked memory device, the more reliable memory devices are used to find the true data. This process is referred to herein as compensating for errors associated with a memory device and makes the ECC code much more reliable. In addition, all or a portion of a channel itself can be marked as faulty (i.e., unreliable). Channel marking is a way of ignoring a single channel (e.g., one out of five) during the error correction code (ECC) decoding and correcting phase of a fetch to improve correctability of the data. The intent of a channel mark is to guard against detected catastrophic channel errors, such as bus errors that cause bad cyclic redundancy check (CRC) data or clock problems, using software and/or hardware logic. When a channel is marked, the ECC hardware treats this channel as an unreliable source of data. Therefore, all bits from that channel get ignored by the ECC logic and only the remaining channels get used in the final determination of data. By ignoring the marked channel, the more reliable channels are used to find the true data. This process is referred to herein as compensating for errors associated with the memory channel and it results in a more reliable ECC code.

After a channel is marked, the software and/or hardware logic may also support up to two dynamic random access memory (DRAM) chip marks which are applied on a per-rank basis to guard against bad memory devices. These DRAM marks are used to protect the fetch data against chip kills (those memory devices that have severe defects). However, if there is an overabundance of DRAM errors in a rank, the DRAM marks may not be sufficient to repair the chip errors. This increases the possibility for uncorrectable errors (UEs) if additional memory devices fail after the two memory devices of that rank are marked, particularly if another channel has already been marked. In addition, to device failures, certain calibration errors can also cause a high rate of channel errors which could lead to UEs. If this happens, any number of DRAMs may be affected causing DRAM mark availability to be limited.

Further descriptions of chip and channel marking may be found, for example, in U.S. patent application Ser. No. 12/822,469 titled "RAIM System Using Decoding of Virtual ECC" and U.S. patent application Ser. No. 12/822,503 titled "Error Correction and Detection in a Redundant Memory System", both filed on Jun. 24, 2010, the contents of which are hereby incorporated by reference in their entirety.

U.S. patent application Ser. No. 12/981,017 titled "Channel Marking for Chip Mark Overflow and Calibration Errors", filed on Dec. 29, 2010, the contents of which are hereby incorporated by reference in its entirety describes a RAIM system where improved data protection is provided by marking an entire memory channel when the number of bad chips exceeds a maximum correctable chip mark count for a single rank. The improved data protection is applied across all ranks in the memory system and prevents UEs in situations where a larger number of memory chips fail than can be safely corrected using ECC and CRC alone.

In some cases, performing channel marking based on one or more ranks of DRAM errors can cause a subsequent problem (e.g., a system checkstop). On such case is when there is a channel error on another channel in the future. This is because the channel mark is committed for the channel that had DRAMs with the largest number of errors in a particular rank at the time that the channel to be marked was selected. However, in hindsight, if future failures are more extreme on a different channel, it would have been more advantageous to suppress the channel mark until the later event. Thus, selecting an entire memory channel to be marked based on currently failing DRAMs will cause some error scenarios to become worse.

Embodiments described herein use a hierarchical channel marking scheme that includes lower level channel marks that are applied on a "per-rank" basis. Therefore, if one rank has problems with a particular channel, a dynamic channel mark for that channel can be used when the rank is accessed. However, another rank can use a different dynamic channel mark for a DRAM overflow marking. This way, there can be asymmetry in the failures within DRAMs across different channels and the granularity of per-rank channel marks can solve more failure scenarios. Further embodiments include a higher level channel mark (global) that applies to all ranks within a channel. The global channel mark can override the per-rank channel marking.

In an embodiment, memory scrubbing is performed on the memory devices. Memory device counts from the scrubbing are accumulated for all memory devices in a rank and chip marks are used to "spare out" memory devices which have high error counts. If chip marks are exhausted, there is usually a call home for a replacement memory module. However, in an embodiment, if there are no existing channel marks within the rank, the firmware will set a per-rank channel mark. Similarly, some calibration errors or other indicators that are rank specific can also be applied on a per-rank basis. Other errors, such as CRC, bus, catastrophic memory module failures, and global calibration errors can still set the global channel mark for an entire channel. In an embodiment, the hardware will automatically determine the per-rank DRAM chip and channel marks. Before applying the per-rank channel mark it is determined if there is a global channel mark that has been set in the memory system. If a global channel mark has been set, then the per-rank channel mark will not be applied. The chip marks will be applied in either case.

As used herein, the term "memory channel" refers to a logical entity that is attached to a memory controller and which connects and communicates to registers, memory buffers and memory devices. Thus, for example, in a cascaded memory module configuration, a memory channel would include the connection means from a memory controller to a first memory module, the connection means from the first memory module to a second memory module, and all intermediate memory buffers, etc. As used herein, the term "channel failure" refers to any event that can result in corrupted data appearing in the interface of a memory controller to the memory channel. This failure could be, for example, in a communication bus (e.g., electrical, and optical) or in a device that is used as an intermediate medium for buffering data to be conveyed from memory devices through a communication bus, such as a memory hub device. The CRC referred to herein is calculated for data retrieved from the memory chips (also referred to herein as memory devices) and checked at the memory controller. In the case that the check does not pass, it is then known that a channel failure has occurred. An exemplary embodiment described herein applies to both the settings in which a memory buffer or hub device that computes the CRC is incorporated physically in a memory module as well as to configurations in which the memory buffer or hub device is incorporated to the system outside of the memory module.

The capabilities of ECC and CRC are used to detect and correct additional memory device failures occurring coincident with a memory channel failure and up to two additional chip failures. An embodiment includes a five channel RAIM that implements channel CRC to apply temporary marks to failing channels. In an embodiment, the data are stored into all five channels and the data are fetched from all five channels, with the CRC being used to check the local channel interfaces between a memory controller and cascaded memory modules. In the case of fetch data, if a CRC error is detected on the fetch (upstream), the detected CRC error is used to mark the channel with the error, thus allowing better protection/correction of the fetched data. This eliminates the retry typically required on fetches when errors are detected, and allows bad channels to be corrected on the fly without the latency cost associated with a retry. An embodiment as described herein can be used to detect and correct one failing memory channel using a temporary mark coincident with up to two memory device failures occurring on one or two of the other memory modules (or channels).

In an embodiment, if the number of chip marks within a rank exceeds a threshold, and if there are no existing channel marks associated with the rank, the channel will be marked with a per-rank channel mark. In an embodiment, the previous chip marks within the rank that are on the channel with the per rank channel mark are freed up for reuse. In an embodiment, previous chip marks within the rank that are on the channel with the per rank channel mark are kept. This is to protect these defective chips when a global or higher-priority channel mark nullifies the per rank channel mark. The additional per-rank channel mark protects that channel within the rank against more DRAM failures within that channel. In an additional embodiment, a calibration process may detect errors and mark chips or channels (global or per-rank) accordingly.

In an embodiment ECC code supports marking of up to two chips per-rank. In addition, the ECC code supports marking a channel (global or per-rank) so that a future decode by the ECC code will not falsely use any data from the marked channel for future corrections.

In an embodiment, once three or more chips within a rank are determined to be bad, the scrub marking code will select the channel within the rank with the highest number of chip marks and set a per-rank channel mark. In an embodiment the per-rank channel mark applies to one rank within a memory subsystem. In an embodiment, when the channel has been marked, the ECC code still supports marking of two additional chips, and detection of a third bad chip.

In an additional embodiment, when there is a periodic calibration that causes interfaces to be marginally working (i.e. a transient, or temporary errors), an error indication occurs. Some calibration errors cause data errors. Since these catastrophic errors can occur as a result of a bad calibration, the calibration status within a channel can be used to immediately mark that channel (e.g., with a global channel mark) so the errors that result can be corrected.

FIG. 1 illustrates a block diagram of a cascade interconnect memory system that may be implemented by an embodiment. The memory system depicted in FIG. 1 includes multiple independent memory interface busses 110 that are logically aggregated together to operate in unison to support a single independent access request from a memory controller 102. The servicing of the single independent access request includes data and error detection/correction information distributed or "striped" across the memory interface busses 110 and associated memory devices located on the memory modules 104 by a RAIM module 108. The RAIM module 108 coordinates the striping of data and ECC across each of the parallel memory interface buses 110. An embodiment also includes CRC error detection being performed on data being transferred on the memory interface busses 110 between the memory controller 102 and the memory modules 104.

As shown in the embodiment depicted in FIG. 1, the memory controller 102 attaches to five narrow/high speed point-to-point memory interface busses 110, with each of the memory interface buses 110 connecting one of five memory controller interface channels to a cascade interconnect memory module 104 (or memory subsystem). In an embodiment, each memory module 104 includes at least one hub device 114 and one or more memory devices. In another embodiment, there is a hub device that is outside of the actual memory module 104 (as would be the case with so-called industry standard DIMMs). As depicted in FIG. 1, the memory interface busses 110 operate in unison to support an access request from the memory controller. In an exemplary embodiment, there may exist a multiplicity of outstanding fetch and store requests to the multiple cascades in the memory subsystem.

Each of the memory interface buses 110 in the embodiment depicted in FIG. 1 includes an upstream bus 112 and a downstream bus 106. One of the functions provided by the memory modules 104 (e.g., a hub device 114 located on the memory module 104) is a re-drive function to send signals on the upstream bus 112 to the memory controller 102 or on the downstream bus 106 to other memory modules 104. In an embodiment, up to two memory modules 104 are cascade connected to each of the memory interface buses 110. In an embodiment, the memory interface buses 110 are implemented using differential clock and data signals (i.e., each clock and data signal requires two wires). In an embodiment, the downstream bus 106 includes thirty-two wires to support: one clock signal, thirteen data/command signals (or bits), one general purpose spare lane (which can be used to spare a clock or a data/command signal), and one spare data/command lane. In this embodiment, each data packet is transferred over the downstream bus 106 in twelve beats and includes eighteen CRC bits. In an exemplary embodiment, the upstream bus 112 includes forty-six wires to support: one clock signal, twenty data/command signals, one general purpose spare lane (which can be used to spare a clock or a data/command signal), and one spare data/command lane. In this embodiment, each data packet is transferred over the upstream bus 112 in eight beats and includes sixteen CRC bits.

As used herein, the term "RAIM" refers to redundant arrays of independent memory modules (e.g., dual in-line memory modules or "DIMMs). In a RAIM system, if one of the memory channels fails (e.g, a memory module in the channel), the redundancy allows the memory system to use data from one or more of the other memory channels to reconstruct the data stored on the memory module(s) in the failing channel. The reconstruction is also referred to as error correction.

In an embodiment, the memory system depicted in FIG. 1 is a RAIM memory system and the five channels are lock step channels (i.e., the five memory interface buses 110 are accessed in unison with each other). The RAIM module 108 in this implementation has the property that one of the channel's data is the bitwise XOR of the other four channels' data. Additional checks are included in order to correct for additional errors. As used herein, the term "mark" refers to an indication given to an ECC that a particular symbol or set of symbols of a read word are suspected to be faulty. The ECC can then use this information to enhance its error correction properties.

As it can be seen from the table in FIG. 5, in an embodiment, when a per-rank channel mark is placed, the RAIM ECC can correct at least one unknown bit error (and sometimes an entire unknown chip error), depending on how many additional chip marks (suspected chip errors) are in place in the rank. At most one channel in each rank may be marked at any given time by a per-rank channel mark.

In accordance with an exemplary embodiment, if an error is caught by the channel CRC, then a temporary global channel mark can be placed which will allow the RAIM ECC to correct additional possible errors. This global channel mark will cause the per-rank channel marks to be removed as only one channel within each rank may be marked at any given time. Memory channel failure may require replacement, but the integrity of the concurrently accessed data is not destroyed (i.e., the error is a correctable error or a "CE") by the failure of a single memory channel. Upon a memory channel being marked (global or per-rank) any subsequent reads are calculated from the distributed parity such that the memory channel failure is masked from the end user (i.e., the marked memory channel is ignored).

As used herein, the term "correctable error" or "CE" refers to an error that can be corrected while the system is operational, and thus a CE does not cause a system outage. As used herein, the term "uncorrectable error" or "UE" refers to an error that cannot be corrected while the memory system is operational, and thus presence of a UE may cause a system outage or a job abends/restarts, during which time the cause of the UE can be corrected (e.g., by replacing a memory device, by replacing a memory module, recalibrating an interface, taking defective memory locations offline).

As used herein, the term "coincident" refers to the occurrence of two (or more) error patterns or error conditions that overlap each other in time. In one example, a CE occurs and then later in time, before the first CE can be repaired, a second failure occurs. The first and second failure are said to be coincident. Repair times are always greater than zero and the longer the repair time, the more likely it would be to have a second failure occur coincident with the first. Some contemporary systems attempt to handle multiple failing devices by requiring sparing a first device or module. This may require substantially longer repair times than simply using marking, as provided by exemplary embodiments described herein. Before a second failure is identified, embodiments provide for immediate correction of a memory channel failure using marking, thus allowing an additional correction of a second failure. Once a memory channel failure is identified, an embodiment provides correction of the memory channel failure, up to two marked additional memory devices and a new single bit error. If the system has at most one marked memory device together with the marked channel, then an entire new chip error can be corrected. The words "memory channel failure" utilized herein, includes failures of the communication medium that conveys the data from the memory modules 104 to the memory controller 102 (i.e., through one of the memory interface buses 110), in addition to possible memory hub devices and registers.

Figure 2:
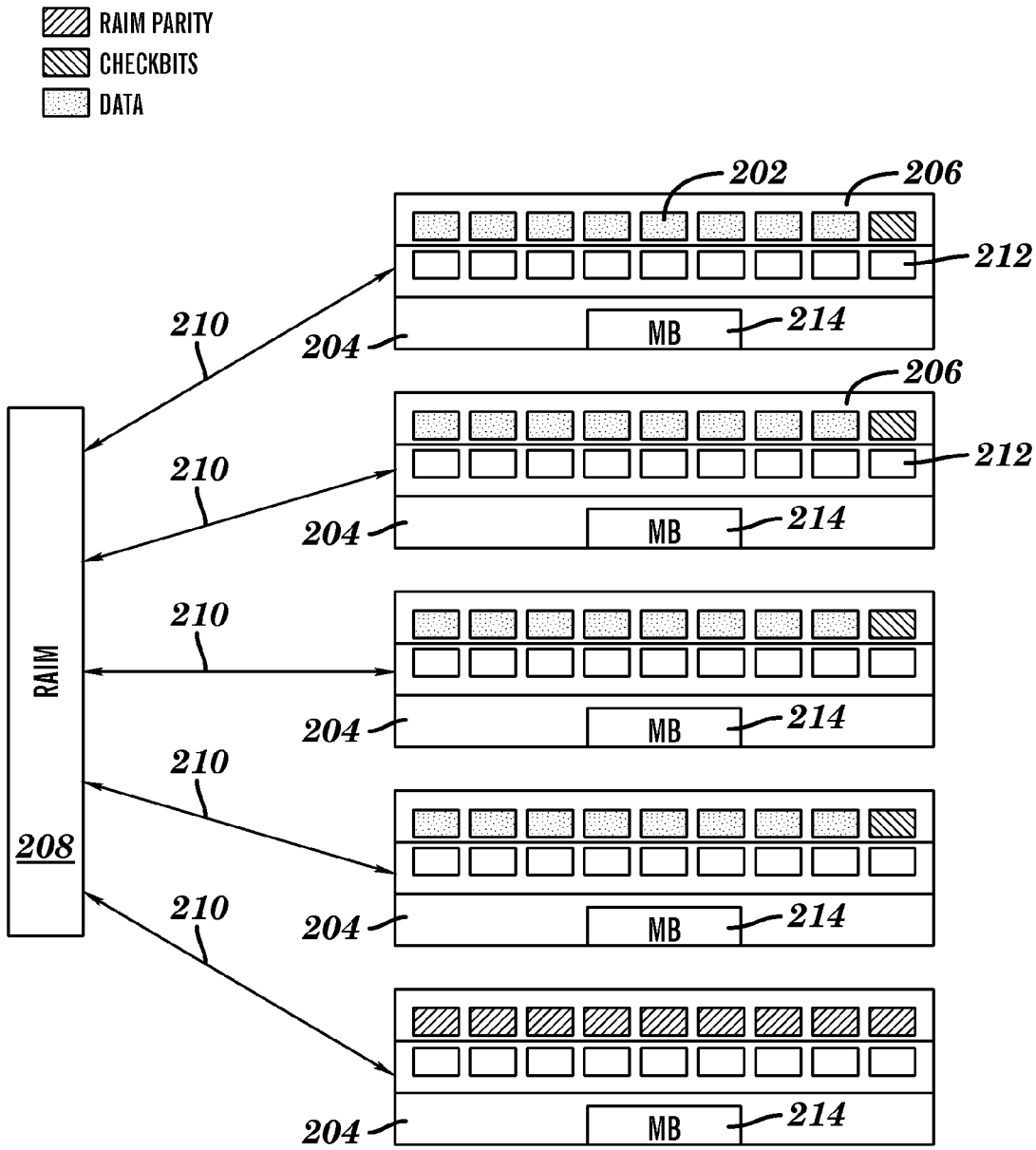
FIG. 2 illustrates a memory system in accordance with an embodiment.

FIG. 2 illustrates a memory system in accordance with an embodiment. The memory system includes a RAIM controller 208 that is in communication with five DIMMs 204 via memory interface buses 210. Each DIMM 204 includes a memory buffer device 214 as well as two ranks 206 212 of memory devices 202. In this example, a first rank 206 includes nine memory devices 202 and a second rank 212 includes nine memory devices 202. As shown in FIG. 2, the first rank 202 on one of the DIMMs 204 includes RAIM parity data, and one memory device 202 from the first rank 202 on each of the each of the other four channels includes checkbits. The parity data and check bits are used for CRC and ECC as is known in the art.

Embodiments described herein are not limited to the memory system configurations shown in FIG. 1 and FIG. 2. Embodiments may be implemented on any memory system configurations known in the art. Another memory system configuration where embodiments may be implemented includes a memory system with DIMMs that have a planar hub chip.

Figure 3:
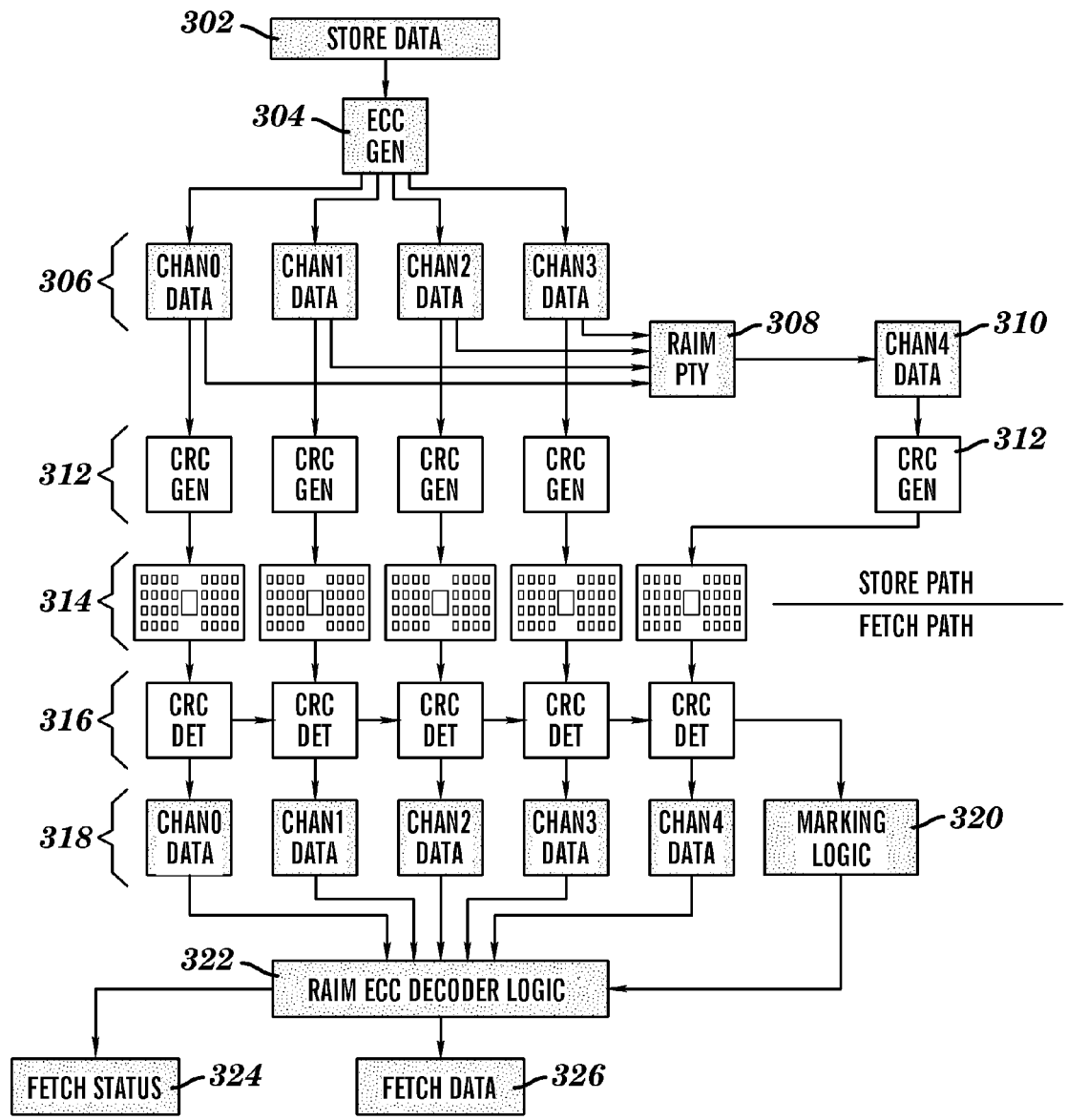
FIG. 3 illustrates a block diagram of a redundant array of independent memory (RAIM) store and fetch path that implements both error correction code (ECC) and channel cyclical redundancy check (CRC) implemented in accordance with an embodiment.

FIG. 3 illustrates a block diagram of a RAIM store and fetch path that implements both ECC and CRC implemented in accordance with an embodiment. In an embodiment, the store path is implemented by hardware and/or software located on the memory controller 102. In addition, the store path may be implemented by hardware and/or software instructions located on a memory module 104 (e.g., in a hub device/memory buffer on the memory module). The RAIM configuration depicted in FIG. 3, which includes a memory channel that is dedicated to storing parity information, has some similarities to a RAID 3 configuration (i.e., striped disks with dedicated parity), although as described earlier in reference to FIG. 1, a RAIM ECC code may be implemented that includes additional checks that are stored that allow for functionality well beyond the RAID 3 capabilities. As depicted in FIG. 3, data from the five channels are combined in a way that protects data against loss of any one memory channel (e.g., a memory module 104).

In the RAIM store path depicted in FIG. 3, the ECC generator 304 receives store data 302 and outputs four groupings of channel data 306 that include ECC checkbits. The channel data 306 are input to individual CRC generators 312 and are also input to a RAIM parity generator 308 that outputs RAIM parity bits as channel data 310. The combination of the ECC checkbits and the RAIM parity bits described above are the overall checkbits of the RAIM ECC. The channel data 306 310 are input to the CRC generators 312 to generate CRC bits for the channel data 306 and 310. Output from the CRC generators 312 (including CRC and data bits) are then output to the downstream bus 106 (or channel) for transmission to the memory modules 314. As shown in FIG. 3, the data being stored on the memory modules 314 are supplemented by ECC. In an embodiment, the CRC bits are used for bus protection and are not stored.

In an embodiment, the fetch path is implemented by hardware and/or software located on the memory controller 102. In addition, the fetch path may be implemented by hardware and/or software instructions located on a memory module 104 (e.g., in a hub device on the memory module). As shown in FIG. 3, the RAIM fetch path includes receiving data on an upstream bus 112 from the memory modules 314. The CRC detectors 316 depicted in FIG. 3 are utilized to detect a channel error, and to temporarily mark a failing channel.

Output from the CRC detectors 316 are the channel data 318, which include data and ECC bits that were generated by an ECC generator, such as ECC generator 304. In addition, the CRC detectors 316 output data to the marking logic 320 (also referred to herein as a "marking module") to indicate which channels are in error. In an embodiment the marking logic 320 generates marking data indicating which channels and memory devices are marked. The marking data tracks both global channel marks and per-rank channel marks. The channel data 318 and the marking data are input to RAIM module 322 where channel data 318 are analyzed for errors which may be detected and corrected using the RAIM ECC and the marking data received from the marking logic 320. Output from the RAIM module 322 are the corrected data 326 (in this example 64 bytes of fetched data) and a fetch status 324. Embodiments provide the ability to have soft errors present (e.g., failing memory devices) and also channel failures or other internal errors without getting UEs. Embodiments also provide for parity or ECC or other protection on the corrected output data 326 as understood in the art.

Figure 4:
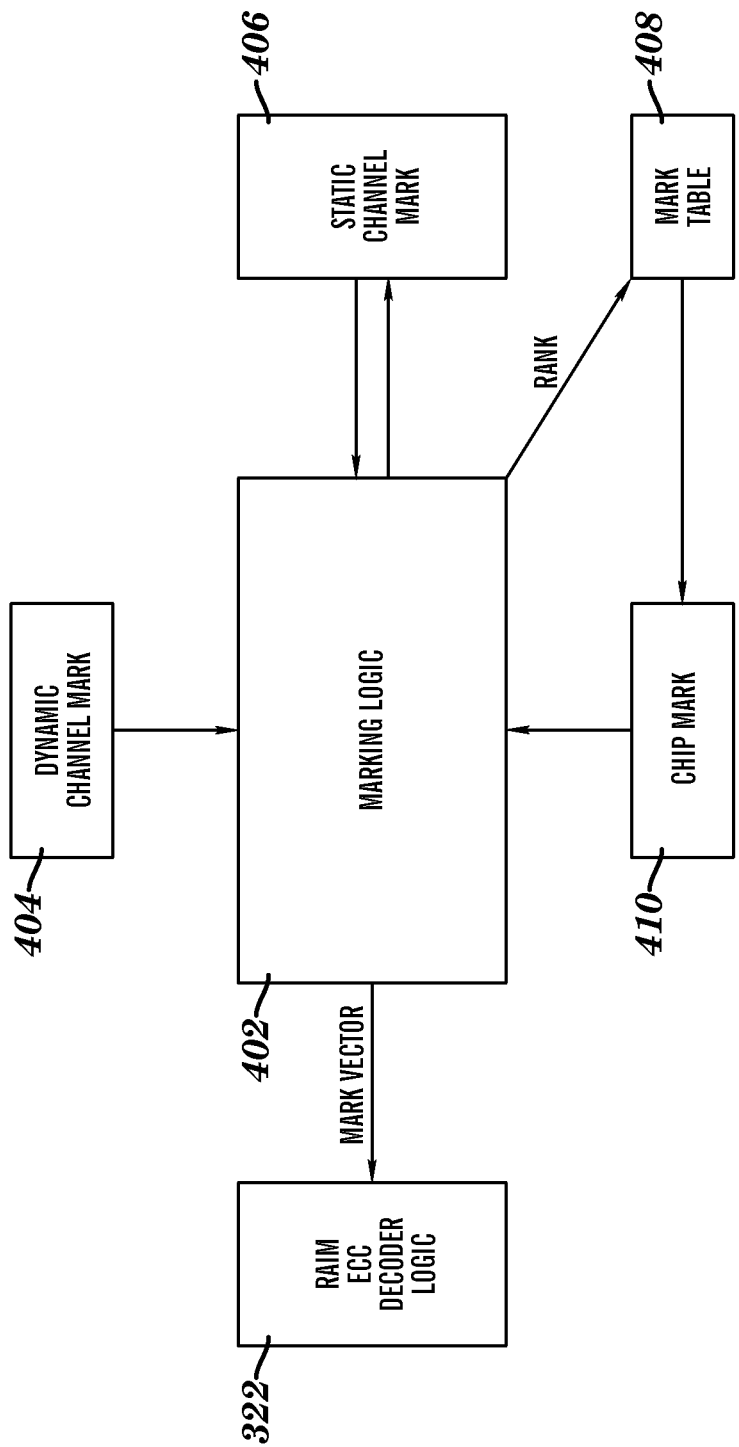
FIG. 4 illustrates a block diagram of marking logic in accordance with an embodiment.

FIG. 4 illustrates a block diagram of marking logic in accordance with an embodiment. In an embodiment, the marking logic illustrated in FIG. 4 is executed in the marking logic 320 of FIG. 3. In an embodiment the marking logic 402 receives dynamic channel marking data 404. In an embodiment the global dynamic channel marking data 404 is received from the CRC detectors 316 of FIG. 3. The CRC detectors 316 detect errors at each of the channels and dynamically flag them as faulty until a data recovery occurs. Once data validation and recovery occurs, such as from a scrubbing process, the flags are removed. In an embodiment, the global dynamic channel marking data 404 is a vector of bits. In one embodiment the global dynamic channel marking data 404 is a 5-bit vector indicating which of the 5 channels have been dynamically marked.

In an embodiment, the marking logic 402 additionally receives static channel mark data 406. The static channel mark data 406 indicates the channels that have permanent errors and need to be replaced. The static channel mark data 406 includes data for both entire channels (corresponding to global channel marks) and for portions of channels (corresponding to per-rank channel marks). In an embodiment the static channel mark data 406 is updated by marking logic 402. Marking logic 402 can be implemented in hardware, software, firmware, or any combination of hardware, software, or firmware. In an embodiment the mark table 408 tracks all of the per-rank channel marks and chip marks in each rank of the memory.

In an embodiment, the marking logic 402 also receives chip mark data 410. In an embodiment the chip mark data 410 is stored in the mark table 408. In an embodiment of the mark table 408, a rank is supplied to the table to enable look-up of the chip marks. The chip mark data 410 is a vector of data indicating which, if any, memory devices in the given rank have been marked. In an embodiment, the chip mark data 410 includes an x mark indicating a first marked chip, and a y mark indicating a second marked chip. The marking logic 402 combines the results of all of the data and calculates if any of the channels should be marked with a per-rank channel mark or with a global channel mark. In an embodiment, chip marks are freed up in a marked channel (global or per-rank) based on logic as will be described in more detail below. If the marking logic 402 calculates that a channel mark (global or per-rank) is appropriate, it updates the static channel mark table 406. The marking logic 402 supplies a mark vector indicating the hardware channels (global and within a rank) and memory devices that have been marked to the RAIM ECC decoder logic 322 which uses the data to efficiently correct any errors in the data.

FIG. 5 illustrates a table of error coverage of per-rank channel marking in accordance with an embodiment. Notice that, in the absence of any per-rank channel marks, all single or double DRAM chip errors isolated to a single channel within a rank are always 100% correctable, whether there are single or double DRAM chip marks. Also note, until/unless a global channel mark is applied to the RAIM, the error coverage shown in FIG. 5 is provided independently to each rank within the RAIM.

FIG. 6A illustrates an embodiment of a memory design. The table represents a 5 channel RAIM design with eight ranks (represented by the rank rows numbered 0 through 8) and with 5 channels (represented by the channel columns numbered 0 through 4). The nine circles in each table entry represent the nine memory devices (e.g. DRAM chips). When a rank is accessed, all forty-five chips in a rank are accessed by ECC (represented by the 45 circles across the five columns in that row). In order to demonstrate how device and channel marking works, some exemplary defective and non-defective chips are shown in FIG. 6. The open circles represent devices that have few or no defects (i.e. below a threshold). The closed circles represent defective devices (e.g. chip 'kills'). An exemplary failing sequence is described later.

FIG. 6B illustrates an embodiment of a mark table 408. Similar to the table in FIG. 6A, each row represents a rank of memory (i.e. a group of DRAM chips that can be accessed at the same time by the ECC code). For each rank, the ECC supports up to two chip marks (i.e. chip mark X and chip mark Y) and one channel mark. The table allows for independent chip and channel marks for each rank in the memory system. The location of a chip mark may be stored in any manner including a sixteen-bit vector used by the ECC code or as an individual vector of 45 bits. The location of a per-rank channel mark may be stored in any manner including as a three bit indicator or as a vector. In addition, the per-rank channel mark data does not have to be located in the mark table, and may be stored in any location that is accessible by the marking logic 402.

A possible failure scenario is depicted in FIG. 6A. Consider the following chip defects that manifest themselves in time (either instantaneously, at a slow regular rate, or sporadically) in the following order: rank 1/channel 3/chip 7; rank 4/channel 2/chip 1; rank 4/channel 2/chip 8; rank 1/channel 1/chip 2; rank 1/channel 3/chip 1; rank 4/channel 2/chip 6; When rank 1/channel 3/chip 7 is determined to be bad, a chip mark x in rank 1 is assigned to channel 3, chip 7 in the mark table. From this point on, when rank 1 is accessed, this chip will be marked by the ECC logic for special correction. Likewise, when other chip marks are added to the mark table, those chip marks are applied by the RAIM ECC decoder logic 322. When rank 4/channel 2/chip 1 is determined to be bad, a chip mark x in rank 4 is assigned to channel 2, chip 1. When rank 4/channel 2/chip 8 is determined to be bad, a chip mark y in rank 4 is assigned to channel 2, chip 8. When rank 1/channel 1/chip 2 is determined to be bad, a chip mark y in rank 1 is assigned to channel 1, chip 2. Note that at this point, both ranks 1 and ranks 4 happen to have both chip marks used in their respective ranks (i.e. chip mark x and chip mark y) used. When rank 1/channel 3/chip 1 is determined to be bad, no more chip marks are available in that rank. While it is possible to apply a global channel mark for all ranks based on prior art, it is advantageous to only apply a channel mark for rank 1, since that is the only rank that has used up all its chip marks. Therefore, as shown in the mark table in FIG. 6B, the channel mark for rank 1 is set to channel 3.

In an embodiment, the channel mark is selected based on the last failure in the rank. In another embodiment, the channel mark is based on the channel with the most total chip defects. In an embodiment, the chip marks x and y are reset when a per rank channel mark is set. In another embodiment, the chip marks are not reset so that hierarchical channel marking can be applied without losing device marks for channels that do not get the per rank channel mark applied. Because rank 1 overflowed its two chip marks allotted, a call home is made to request replacement parts. If there is another error before the part is replaced, the per rank channel marking is still in use until the bad part is replaced and can add further value. For instance, when rank 4/channel 2/chip 6 is determined to be bad, there are, again, no more chip marks. Therefore, as shown in the mark table in FIG. 6B, the channel mark for rank 4 is set to channel 2. Note that, had a global channel mark been applied to channel 3, based on rank 1, then this last rank 4 failure would continue to have CEs and channel 2 chips do not have the level of protection they would have with this invention.

Figure 7:
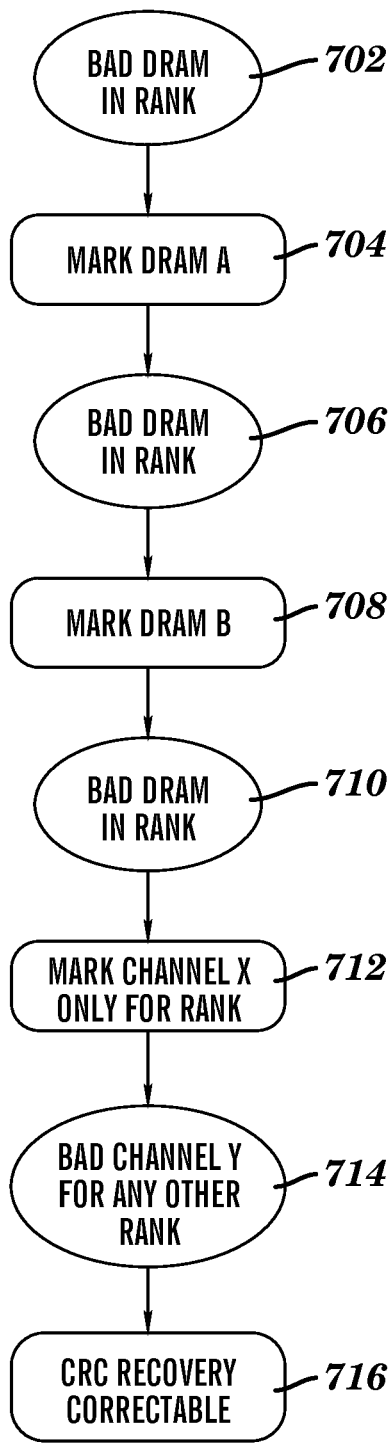
FIG. 7 illustrates a process flow of per-rank channel marking in accordance with an embodiment and a particular set of defects.

FIG. 7 illustrates one example of a process flow of per-rank channel marking in accordance with an embodiment and a particular set of defects. In an embodiment, the processing shown in FIG. 7 is implemented by the marking logic 402. At block 702, a bad DRAM is detected (via ECC) in a rank and at block 704, the DRAM is marked. At block 706, a second bad DRAM is detected in the rank and at block 708, the second DRAM is marked. At block 710, a third bad DRAM is detected in the rank and at block 712, the channel containing the three bad DRAMS is marked only for the rank by marking the channel with a per-rank channel mark. At block 714, a DRAM in another rank and located on a different channel is detected. At block 716, the memory system continues to run as the defect detected at block 714 is CRC recovery correctable. Thus, having the per rank channel mark allows each rank/channel combination to operate independently for error recovery. This extends the error correcting capabilities of the memory system for cases where ranks of memory devices are experiencing memory device failures on different channels.

Figure 8:
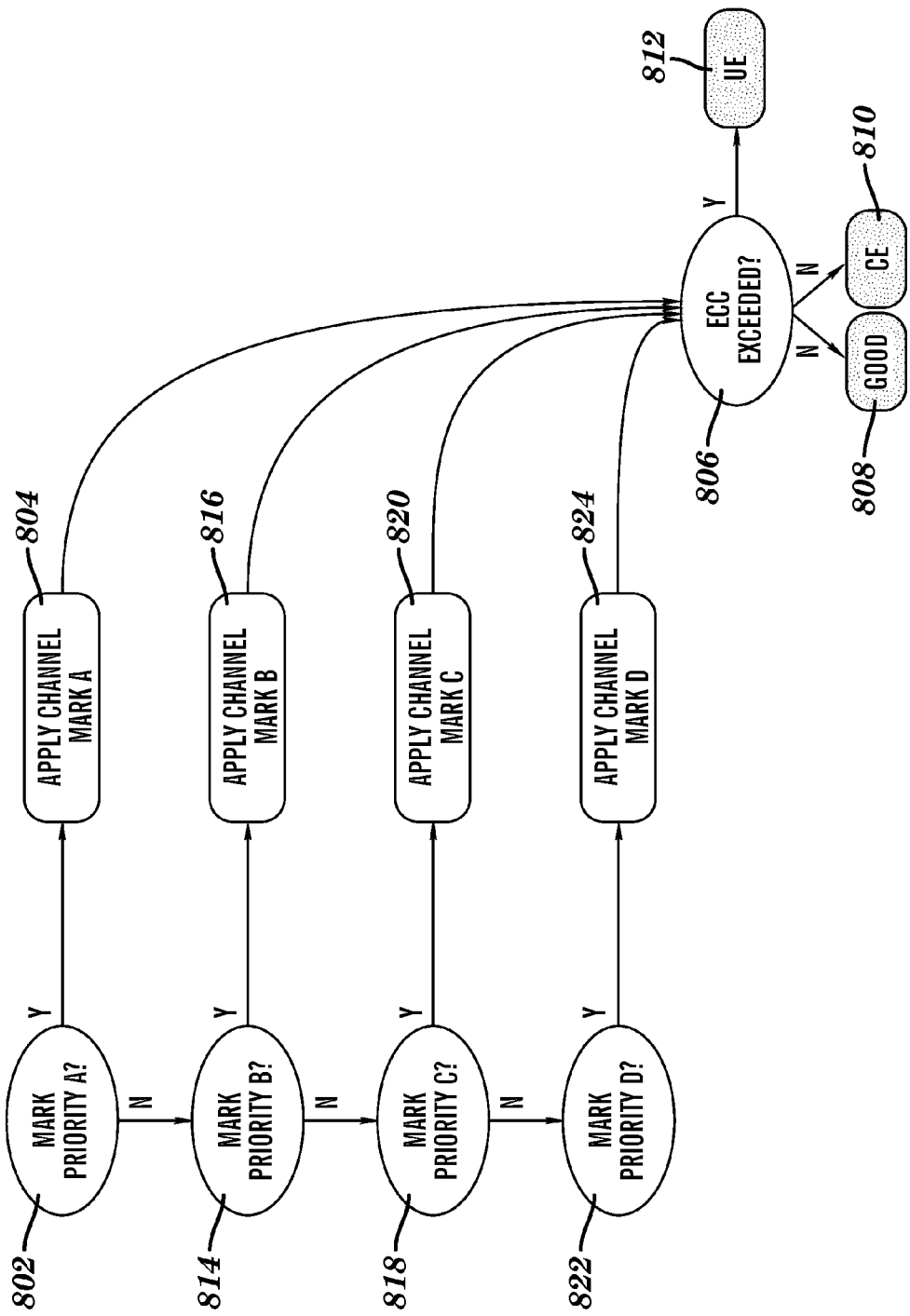
FIG. 8 illustrates a process flow of hierarchical channel marking in accordance with an embodiment.

FIG. 8 illustrates a process flow of channel mark selection in a hierarchical channel marking in accordance with an embodiment. In an embodiment, the processing shown in FIG. 8 is implemented by marking logic 402 and is used to process the marks. The process flow shown in FIG. 8 is used to resolve any conflicts between channel marks (e.g., from different sources). Referring to FIG. 8, at block 802, it is determined if the channel mark should be a priority "A" channel mark. The determination of priority "A" is typified by errors that cause severe per-channel corruption (e.g. CRC errors, control errors, loss of clocks, etc). If the channel mark should be a priority "A" channel mark, then processing continues at block 804 where channel mark "A" is applied to the channel for use by the marking logic when the data is decoded.

In an embodiment, the channel mark is set (also referred to herein as "the channel mark is applied") using any means known in the art, such as, but not limited to: dynamically sending a channel mark "A" vector into the ECC logic to be used as a channel mark for error correction.

In an embodiment, a priority A channel mark is a global channel marker with the highest priority and it causes the ECC logic to compensate for any errors in an entire channel (across all ranks). Thus, in an embodiment, the compensation causes the entire channel to be ignored by the ECC logic. Processing then continues at block 806. In an embodiment shown in FIG. 8, if a priority mark is applied, then lower level priority marks are blocked. If there are no priority "A" channel marks, processing continues at block 814. At block 814, it is determined if the channel mark should be a priority "B" channel mark. If the channel mark should be a priority "B" channel mark, then processing continues at block 816 where channel mark "B" is applied to the channel for use by the marking logic. In an embodiment, a priority "B" channel mark is the next highest priority channel mark (when compared to a priority "A" channel mark) and it may cause the ECC logic to compensate for any errors in an entire channel within a rank (i.e., it is a per-rank channel mark). Thus, in an embodiment, the compensation causes the entire channel within the rank to be ignored by the ECC logic. Processing then continues at block 806.

Processing continues at blocks 818-824 to determine and apply other lower priority channel marks to the memory system. Examples of lower priority channel marks include overflows of one or two DRAM spares, marginal chips that do not always fail, chips that have not failed but are likely to fail due to temperature or calibration errors, etc. In embodiments, temperature data is used to set channel marks, per-rank channel marks and chip marks. In embodiments error polling results are used to set channel marks, per-rank channel marks and chip marks.

At block 806, the RAIM ECC decoder logic decodes the data and determines if the ECC capability of the memory system has been exceeded. If the ECC capability has been exceeded then an UE is generated at block 812. Otherwise either the data is good as shown at block 808 or any errors are CEs as shown at block 810. The processing shown in FIG. 8 insures that channel marks are applied in order or priority. Thus, a highest priority channel mark will be applied when there is more than one candidate for channel marking.

Figure 9:
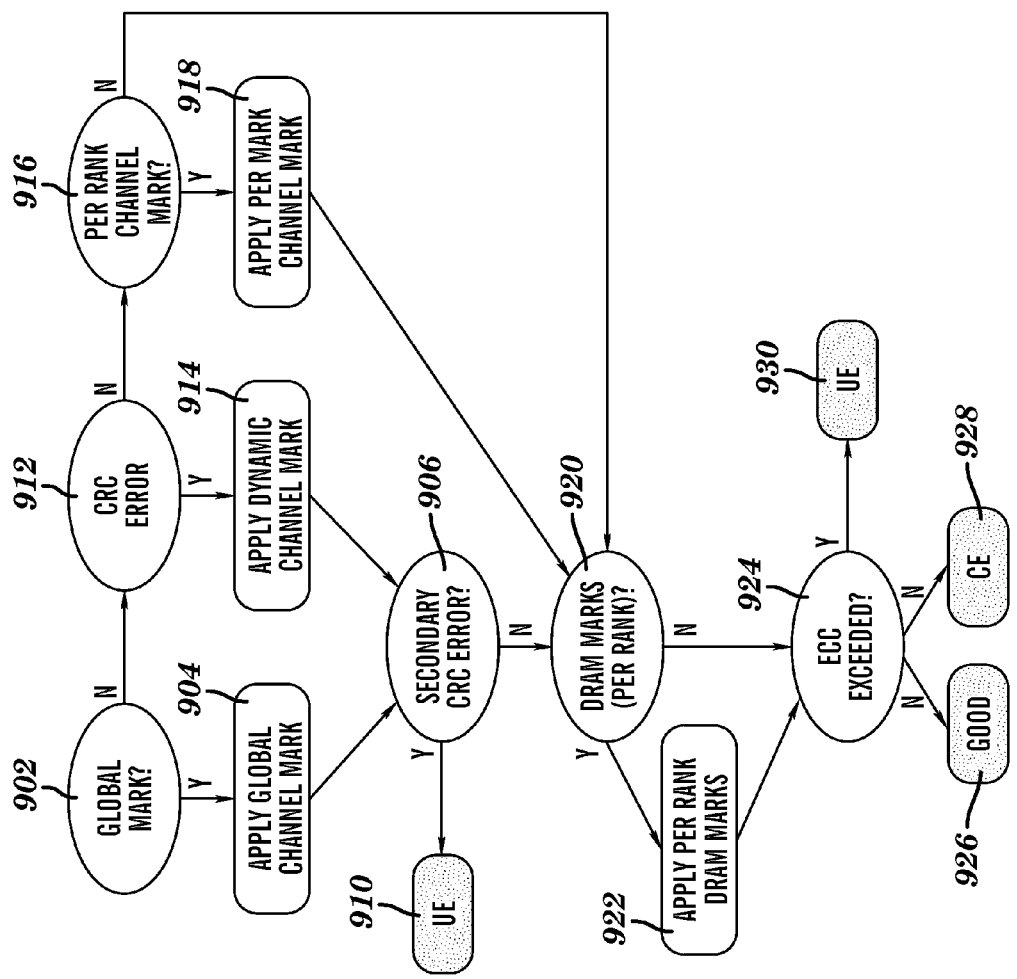
FIG. 9 illustrates a process flow of per-rank hierarchical channel marking in accordance with an embodiment.

FIG. 9 illustrates a process flow of per-rank hierarchical channel marking in accordance with an embodiment and with a particular set of defects. At block 902, it is determined if a global mark should be applied to the channel (e.g., if the channel has failed numerous attempts at recovery due to clock failures, overflow of failing data lanes, solid CRC failures, etc.). If it is determined that the global mark should be applied to a channel, then processing continues at block 904 where a global channel mark is applied to the channel. Processing then continues at block 906 where it is determined if a secondary CRC error has been identified by the CRC detectors. If a secondary CRC error has been identified on another channel, then an UE is generated at block 910. Otherwise processing continues at block 920, where in the event of a DRAM device failure in a DRAM device that is in a different channel than the one marked and in an unmarked per-rank channel/rank combination, it is determined if a chip mark in the same rank as the failing DRAM device is available to mark the bad DRAM device in the rank. If the chip mark is available the processing continues at block 922 where the chip mark is applied to the bad DRAM device in the rank. Processing then continues at block 924 where the RAIM ECC decoder logic decodes the data and determines if the ECC capability of the memory system has been exceeded. If the ECC capability has been exceeded then an UE is generated at block 930. Otherwise either the data is good as shown at block 926 or any errors are CEs as shown at block 928.

If it is determined at block 902 that the global mark should not be applied to the channel, then processing continues at block 912 where it is determined if a CRC error has been detected by the CRC detectors. If a CRC error has been detected, then processing continues at block 914 where a dynamic channel mark is applied to protect the channel data during the CRC error window. Typically, global, permanent marks are applied for previously known or discovered bad channels while CRC temporary marks are applied on sudden, unexpected errors in those channels. In an embodiment, after a certain threshold of failed recovery and CRC errors, a CRC mark will be turned into a global permanent mark by code or hardware. Processing then continues at block 906 where it is determined if a secondary CRC error has been identified by the CRC detectors. If a secondary CRC error has been identified, then an UE is generated at block 910. Otherwise processing continues at block 920, where in the event of a DRAM device failure in a DRAM device that is in a different channel than the one marked and in an unmarked per-rank channel/rank combination, it is determined if a chip mark in the same rank as the failing DRAM device is available to mark the bad DRAM device in the rank. If the chip mark is available the processing continues at block 922 where the chip mark is applied to the bad DRAM device in the rank. Processing then continues at block 924 where the RAIM ECC decoder logic decodes the data and determines if the ECC capability of the memory system has been exceeded. If the ECC capability has been exceeded then an UE is generated at block 930. Otherwise either the data is good as shown at block 926 or any errors are CEs as shown at block 928.

If it is determined at block 912, that a CRC error has not been detected, then processing continues at block 916 where it is determined if a per-rank channel mark should be applied to protect a portion of a channel against an overflow of bad DRAMs within a rank. If it is determined that a per-rank channel mark should be applied to the channel, then processing continues at block 918 and a per-rank channel mark is applied to the channel. Processing continues at block 920, where in the event of a DRAM device failure in a DRAM device that is in a different channel than the one marked and in an unmarked per-rank channel/rank combination, it is determined if a chip mark in the same rank as the failing DRAM device is available to mark the bad DRAM device in the rank. If the chip mark is available the processing continues at block 922 where the chip mark is applied to the bad DRAM device in the rank. Processing then continues at block 924 where the RAIM ECC decoder logic decodes the data and determines if the ECC capability of the memory system has been exceeded. If the ECC capability has been exceeded then an UE is generated at block 930. Otherwise either the data is good as shown at block 926 or any errors are CEs as shown at block 928. If it is determined, at block 916, that a per-rank channel mark should not be applied, then processing continues at block 920.

FIG. 10 illustrates a table of error coverage in accordance with an embodiment. It compares the error correction capabilities of full channel marking with embodiments of per-rank channel marking and hierarchical channel marking. As shown in FIG. 10, the addition of per-rank channel marking allows correction of up to three chip kills on rank "A"/channel "0", simultaneously with correction of up to three chip kills on rank "B"/channel "1", simultaneously with correction of a fourth failing DRAM on rank "B"/channel "1". In an embodiment, a call home (e.g., an automated call for service) is initiated after the three chip kills on rank "A"/channel "0" and three chip kills on rank "B"/channel "1 are detected. Also as shown in FIG. 10, the addition of hierarchical channel marking in combination with per-rank channel marking allows correction when after a third chip kill is detected on rank "A"/channel "0" (and a call home is initiated), a CRC error is detected on rank "B"/channel "1".

Figure 11:
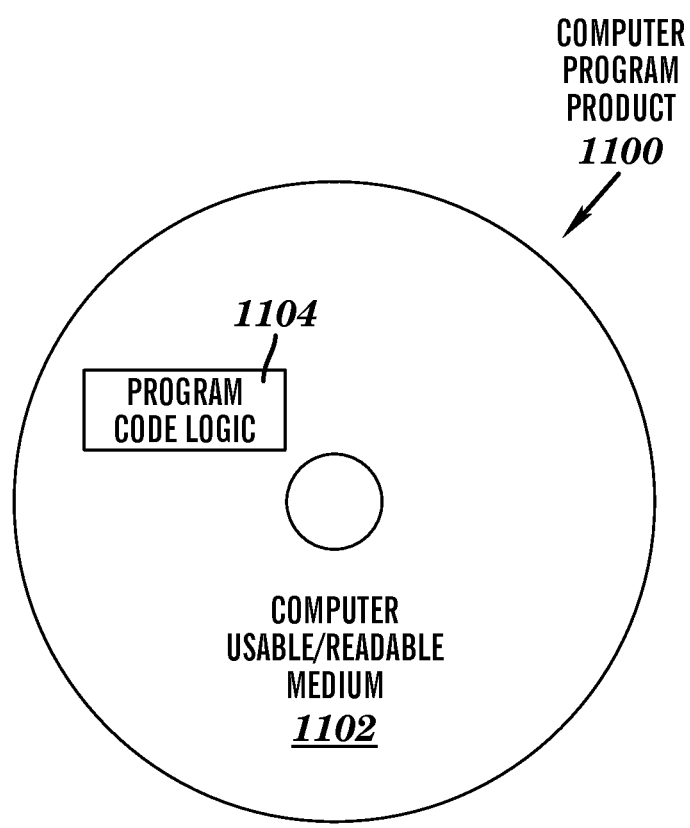
FIG. 11 illustrates a computer program product 1100 in accordance with an embodiment.

As described above, embodiments can be embodied in the form of computer-implemented processes and apparatuses for practicing those processes. An embodiment may include a computer program product 1100 as depicted in FIG. 11 on a computer readable/usable medium 1102 with computer program code logic 1104 containing instructions embodied in tangible media as an article of manufacture. Exemplary articles of manufacture for computer readable/usable medium 1102 may include floppy diskettes, CD-ROMs, hard drives, universal serial bus (USB) flash drives, or any other computer-readable storage medium, wherein, when the computer program code logic 1104 is loaded into and executed by a computer, the computer becomes an apparatus for practicing the invention. Embodiments include computer program code logic 1104, for example, whether stored in a storage medium, loaded into and/or executed by a computer, or transmitted over some transmission medium, such as over electrical wiring or cabling, through fiber optics, or via electromagnetic radiation, wherein, when the computer program code logic 804 is loaded into and executed by a computer, the computer becomes an apparatus for practicing the invention. When implemented on a general-purpose microprocessor, the computer program code logic 1104 segments configure the microprocessor to create specific logic circuits.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A memory system comprising:
a first memory channel, a second memory channel, and error correction code (ECC) logic, the memory system configured to perform a method comprising:
receiving a request to apply a first channel mark to the first memory channel;
determining a priority level of the first channel mark;
receiving a request to apply a second channel mark to the second memory channel;
determining a priority level of the second channel mark;
determining that the priority level of the first channel mark is higher than the priority level of the second channel mark;
marking the first memory channel based on determining that the priority level of the first channel mark is higher than the priority level of the second channel mark; and
performing, by the ECC logic, ECC decoding and correcting, the performing including ignoring bits received via the first memory channel and utilizing bits received via the second memory channel.

2. The memory system of claim 1, wherein the first memory channel and the second memory channel are parallel channels.

3. The memory system of claim 1, wherein the method further comprises applying chip marks to memory devices located on at least one of the first memory channel and the second memory channel.

4. The memory system of claim 1, wherein the method further comprises removing a chip mark on a memory device in the first memory channel in response to marking the first memory channel.

5. The memory system of claim 1, wherein the priority level of at least one of the first channel mark and the second channel mark is programmable.

6. The memory system of claim 1, wherein the priority level of at least one of the first channel mark and the second channel mark is responsive to a detected error in at least one of the first memory channel and the second memory channel.

7. The memory system of claim 1, wherein the priority level of at least one of the first channel mark and the second channel is responsive to a predicted error in at least one of the first memory channel and the second memory channel.

8. The memory system of claim 1, wherein at least one of the first channel mark and the second channel mark is a global channel mark or a temporary cyclical redundancy check (CRC) mark.

9. The memory system of claim 1, wherein at least one of the first channel mark and the second channel mark is set based on temperature data.

10. The memory system of claim 1, wherein at least one of the first channel mark and the second channel mark is set based on polling data.

11. The memory system of claim 1, wherein at least one of the first channel mark and the second channel mark is a per-rank mark.

12. A computer implemented method comprising:
receiving a request to apply a first channel mark to a first memory channel;
determining a priority level of the first channel mark;
receiving a request to apply a second channel mark to a second memory channel;
determining a priority level of the second channel mark;
determining that the priority level of the first channel mark is higher than the priority level of the second channel mark;
marking the first memory channel based on determining that the priority level of the first channel mark is higher than the priority level of the second channel mark; and
performing, by the ECC logic, ECC decoding and correcting, the performing including ignoring bits received via the first memory channel and utilizing bits received via the second memory channel.

13. The method of claim 12, wherein the first memory channel and the second memory channel are parallel channels.

14. The method of claim 12, further comprising applying chip marks to memory devices located on at least one of the first memory channel and the second memory channel.

15. The method of claim 12, further comprising removing a chip mark on a memory device in the first memory channel in response to marking the first channel.

16. The method of claim 12, wherein the priority level of at least one of the first channel mark and the second channel mark is responsive to a detected error in at least one of the first memory channel and the second memory channel.

17. The method of claim 12, wherein the priority level of at least one of the first channel mark and the second channel is responsive to a predicted error in at least one of the first memory channel and the second memory channel.

18. The method of claim 12, wherein the first channel mark is set based on at least one of temperature data and polling data.

19. A computer program product comprising:
a tangible storage medium readable by a processing circuit and storing instructions for execution by the processing circuit for performing a method comprising:
receiving a request to apply a first channel mark to a first memory channel;
determining a priority level of the first channel mark;
receiving a request to apply a second channel mark to a second memory channel;
determining a priority level of the second channel mark;
determining that the priority level of the first channel mark is higher than the priority level of the second channel mark;
marking the first memory channel based on determining that the priority level of the first channel mark is higher than the priority level of the second channel mark; and
performing, by the ECC logic, ECC decoding and correcting, the performing including ignoring bits received via the first memory channel and utilizing bits received via the second memory channel.

20. The computer program product of claim 19, wherein the method further comprises applying chip marks to memory devices located on at least one of the first memory channel and the second memory channel.

* * * * *